(12) United States Patent
Jedema

(10) Patent No.: US 8,357,920 B2
(45) Date of Patent: Jan. 22, 2013

(54) ELECTRONIC COMPONENT, AND A METHOD OF MANUFACTURING AN ELECTRONIC COMPONENT

(75) Inventor: Friso Jacobus Jedema, Eindhoven (NL)

(73) Assignee: NXP B.V., Eindhoven (NL)

( * ) Notice: Subject to any disclaimer, the term of this patent is extended or adjusted under 35 U.S.C. 154(b) by 598 days.

(21) Appl. No.: 12/594,739

(22) PCT Filed: Apr. 17, 2008

(86) PCT No.: PCT/IB2008/051483
§ 371 (c)(1),
(2), (4) Date: Oct. 5, 2009

(87) PCT Pub. No.: WO2008/129480
PCT Pub. Date: Oct. 30, 2008

(65) Prior Publication Data
US 2010/0044665 A1    Feb. 25, 2010

(30) Foreign Application Priority Data
Apr. 20, 2007   (EP) .................................. 07106576

(51) Int. Cl.
*H01L 47/00*   (2006.01)

(52) U.S. Cl. ............. 257/2; 257/3; 257/4; 257/E45.002; 438/95; 438/102

(58) Field of Classification Search .................. 257/2–3, 257/4
See application file for complete search history.

(56) References Cited

U.S. PATENT DOCUMENTS

| 7,715,248 B2 * | 5/2010 | Aitken et al. ............ 365/189.15 |
| 7,961,507 B2 * | 6/2011 | Liu et al. ....................... 365/163 |
| 2004/0052117 A1 | 3/2004 | Jiang |
| 2004/0188735 A1 | 9/2004 | Hideki |
| 2005/0212024 A1 | 9/2005 | Happ |

FOREIGN PATENT DOCUMENTS

| DE | 102004014487 A1 | 11/2005 |
| DE | 102004041893 A1 | 3/2006 |
| EP | 1667244 A | 6/2006 |
| WO | 2004/057684 A1 | 7/2004 |
| WO | 2004057676 A2 | 8/2004 |

* cited by examiner

Primary Examiner — Thien F Tran

(57) ABSTRACT

An electronic component (100) comprising a matrix (102) and a plurality of islands (103) embedded in the matrix (102) and comprising a material which is convertible between at least two states characterized by different electrical properties, wherein the plurality of islands (103) form a continuous path (104) in the matrix (102).

26 Claims, 2 Drawing Sheets

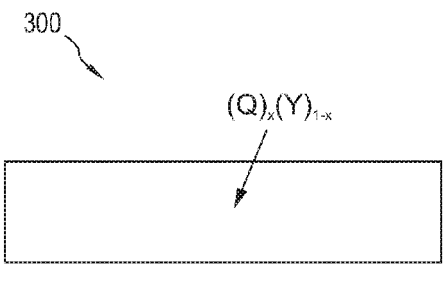
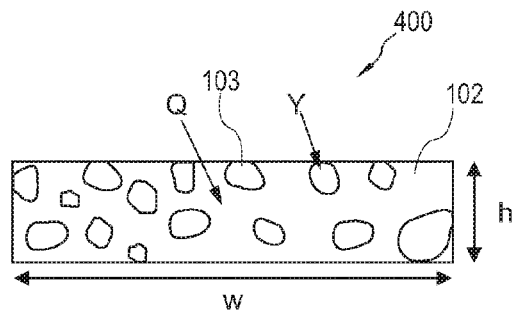
FIG 3  FIG 4
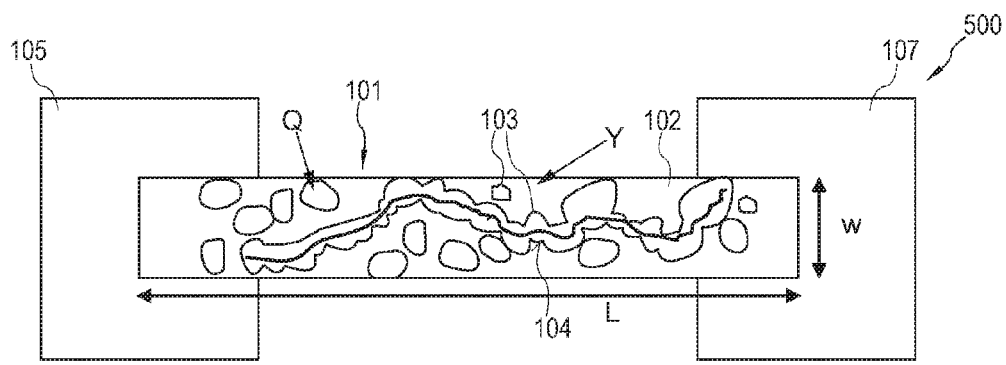
FIG 5
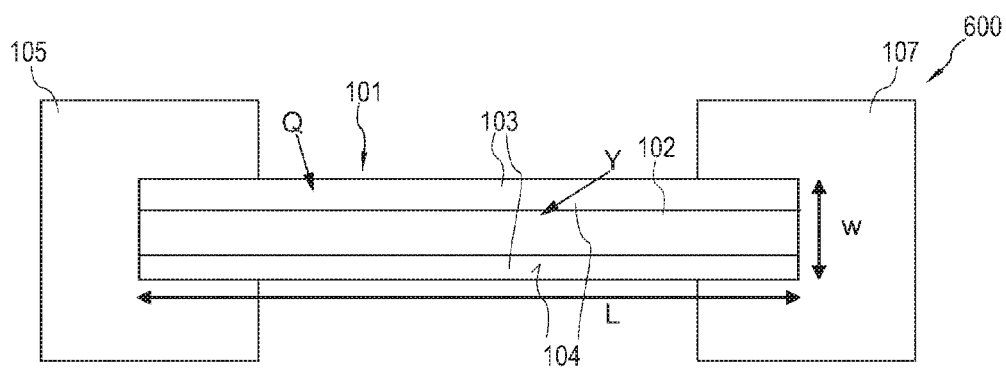
FIG 6

ELECTRONIC COMPONENT, AND A METHOD OF MANUFACTURING AN ELECTRONIC COMPONENT

FIELD OF THE INVENTION

The invention relates to an electronic component.
Moreover, the invention relates to a method of manufacturing an electronic component.

BACKGROUND OF THE INVENTION

In the field of non-volatile memories, flash memory scaling to lower dimensions has become a real issue. Technologies to face this challenge are ferroelectric, magnetic and phase change memories, the latter one being promising for the replacement of flash and showing characteristics that may allow replacement of other types of memories such as DRAM. Phase change memories are a possible solution for the unified memory being an important step in the electronics art. OTP ("on time programmable") and MTP ("multiple times programmable") memories open a field that may present a great opportunity for phase change memories as well.

Phase change memories are based on a reversible memory switching using, for instance, chalcogenide materials. The ability of these materials to undergo fast phase transition has led to the development of rewritable optical media (CD, DVD). The chalcogenide phase change materials may be divided in two classes that are slightly different compositions, based on their crystallization mechanism. The "nucleation dominated" material GeTe—$Sb_2Te_3$ tie line such as $Ge_2Sb_2Te_5$ are generally used in ovonic unified memory (OUM) devices. In this concept, the phase change material may be in contact with a bottom-resistive electrode to switch reversibly to a small volume of phase change material. "Fast growth material", known in optical storage application (CD-RW/DVD+RW), enable very fast switching (for instance 10 ns) with proper phase stability.

Thus, phase change materials may be used to store information. The operational principle of these materials is a change of phase. In a crystalline phase, the material structure is, and thus properties are, different from the properties in the amorphous phase.

US 2005/0212024 A1 discloses a method for producing a memory device, and a memory device having an active material adapted to be placed in a more or less conductive state by means of appropriate switching processes, wherein the active material is embedded in electrically insulating material.

However, the demand of a high value of an electric current required for switching between a crystalline phase and an amorphous phase according to US 2005/0212024 A1 may be problematic.

OBJECT AND SUMMARY OF THE INVENTION

It is an object of the invention to provide an electronic component having a convertible structure that can be heated with a reasonable value of the electric current.

In order to achieve the object defined above, an electronic component and a method of manufacturing an electronic component according to the independent claims are provided.

According to an exemplary embodiment of the invention, an electronic component is provided comprising a matrix and a plurality of islands embedded in the matrix and comprising a material which is convertible between at least two states characterized by different electrical properties, wherein the plurality of islands form a continuous path (which may also be denoted as a percolation path, which may be curved in a complex manner, or which may even be linear, for instance in a scenario in which segregation will result in a separation of thin layers) in the matrix, for instance providing a continuous (electric) connection between two end portions of the electronic component so that a current flow between two electric terminals coupled to the two end portions of the electronic component may be enabled along the continuous path.

According to another exemplary embodiment of the invention, a method of forming an electronic component is provided, the method comprising embedding a plurality of islands (comprising a material which is convertible between at least two states characterized by different electrical properties) in a matrix, and forming a continuous (or connected or contiguous or consecutive) path by the plurality of islands in the matrix.

The term "electronic component" may particularly denote any component, member or apparatus that fulfils any electric, magnetic and/or electronic functionality. This means that electric, magnetic and/or electromagnetic signals may be applied to and/or generated by the electronic device during regular use.

The term "convertible structure" may particularly denote any physical structure having convertible properties. Examples are a phase change structure or a structure with thermo-dependent properties. Phase change materials can have not only two phases but also more than two phases, for instance crystalline, amorphous, meta-amorphous, meta-crystalline, crystalline with a different lattice orientation, etc.

The term "phase change structure" may particularly denote any physical structure which has the property to change any physical parameter or material property under the influence of heat (generated by ohmic losses (Joule heating or resistive dissipation) of an electric current flowing through the phase change structure or an electrically/a thermally coupled heating element, and/or generated by the absorption of electromagnetic radiation). This may particularly mean a switch of a material such as a chalcogenide between an amorphous configuration and a crystalline configuration, which may be accompanied by a significant change in the electrical resistivity. However, any other phase changes such as a change from a solid to a liquid phase, which phase changes are connected with a change of a physical property, may be covered by this term.

The term "memory cell" may particularly denote a physical structure (such as a layer sequence, for instance monolithically integrated in a substrate such as a silicon substrate) which allows to store information in an electronic manner. An amount of information stored in a memory cell may be 1 bit (particularly when the phase change material is switched between two phases representing logical values "1" or "0") or may be more than 1 bit (particularly when the phase change material is switched between at least three phases). The memory cell may be formed on and/or in a substrate that may denote any suitable material, such as a semiconductor, glass, plastic, etc.

The term "substrate" may be used to define generally the elements for layers that underlie and/or overlie a layer or portions of interest. Also, the substrate may be any other base on which a layer is formed, for example a semiconductor wafer such as a silicon wafer or silicon chip.

The term "matrix" may denote one component of a multiple component mixture that surrounds the plurality of islands embedded therein and/or which is surrounded by the plurality of islands. The volume percentage of the matrix may (or may not) be (significantly) larger than the volume percentage of the plurality of islands in the electronic component. Thus, the matrix may be a material enclosing larger grains of the island material.

The term "islands" may particularly denote particles such as beads, spheres, or non-symmetric volumes that are at least partially surrounded by material of the matrix and/or at least partially surround material of the matrix. A (for instance 1 nm thick) thin conductive layer may also fall under the term "plurality of islands, as there is the possibility that a segregation results in a separation of thin layers as well.

The term "continuous path" or "percolation path" may particularly denote a continuous or contiguous structure or route along which an electric current may flow. Therefore, along the percolation path, the islands may be mechanically (and also electrically) connected without interruptions. In other words, the continuous path may reach up to borders of the matrix-island composition so that—in an electrically conductive state of the continuous path—a current may be injected at one end portion of the continuous path, may flow along the continuous path, and may exit the matrix-island composition at the other end portion of the continuous path.

According to an exemplary embodiment of the invention, small islands of a phase change material may be embedded in an electrically insulating matrix to form a conductive part with a high value of the resistivity. As an upper bound of the resistance for exemplary embodiments of the invention, it may be added: $R_{matrix} > R_{cryst.path}$ and/or $\rho_{matrix} > \rho_{cryst.path}$. In practice it may be appropriate if $R_{matrix} > R_{amorphous.path}$ and/or $\rho_{matrix} > \rho_{amorphous.path}$, but this is not a strict limit and thus optionally for the first criterion. For the situation that $R_{cryst.path} < R_{matrix} < R_{amorphous.path}$ a structure is obtained which resembles a parallel heater line, see WO 2004/057676. Thus, the electric programming current necessary for switching the consecutive phase change material islands between a crystalline and an amorphous phase may be reduced, when the programming power is maintained constant. Alternatively, with a constant programming current, the programming power may be reduced. This may allow for a miniature manufacture of electronic components such as memory cells, thereby increasing the integration density of memory cells in a memory array. This is due to the fact that the necessary programming current/power is a limiting factor in reducing the size of phase change material based electronic driving circuitry components.

Since the magnitude of the reset current used to convert a phase change line cell from its crystalline state (SET state) to its amorphous state (RESET state) is a limiting factor to shrink the size of the memory cell, increasing the resistance of a phase change memory element by designing it as a plurality of phase change material islands embedded in a matrix allows to manufacture the electronic component with a reduced size.

According to an exemplary embodiment, a phase change memory element is provided comprising a line cell comprising or consisting of a number (or a matrix) of small islands of a phase change material embedded in a matrix of an insulating material in such a way that a percolation path is formed by the islands.

According to an exemplary embodiment, the matrix with the islands may be made by a self-organizing procedure based on the segregation of two stable components. One may be a phase change material such as $Sb_2Te$, and/or doped $Sb_2Te$ materials (for a larger list of appropriate materials, see WO2004/057684), GeTe or $Sb_2Te_3$ or any other linear combination thereof, for example: $Ge_1Sb_4Te_7$, $Ge_1Sb_2Te_4$ and $Ge_2Sb_2Te_5$. The second one may be an insulator, for instance $GeSe_2$, GeSe, $GeS_2$ or GeS.

Exemplary embodiments of the invention may have the advantage that a reset current I may be reduced by increasing the line resistance R, keeping the total programming power $P=I^2 R$ at the same magnitude. Increased electrical resistance of the line may be obtained without a degradation of all other important phase change read and write memory properties related to the phase change material such as crystallization speed (at elevated temperatures), threshold electric fields, cyclability and data retention (which depends on a crystallization speed at user conditions). An appropriate resistance of the line lies between 1 k$\Omega$ and 10 k$\Omega$. These values are obtained by impedance matching to the drive transistor. At the 65 nm node the available voltage is 1.2 Volt. As about ⅓ of this voltage has to drop across the transistor to able to deliver a proper current of ~400 microamperes ($\mu$A), there remains about 0.8 Volt left to drop across the phase change line resistance R. Necessarily it follows that R~0.8/400 $10^{-6}$=2 k$\Omega$. A very low current that can be achieved—for Black Diamond dielectric with a heat conductivity of 0.3 W/K—is 100 microamperes at 1 Volt. Note that the transistor in this situation only needs 0.2 Volt to deliver 100 microamperes ($\mu$A). Thus, R will not have to exceed V/I=1/100 $10^{-6}$=10 k$\Omega$.

Using patterning dimensions of line width w=50 nm, line length L=100 nm and line height h=20 nm, the 1 to 10 k$\Omega$ line resistance R results in an "effective resistivity $\rho_{eff}$" of $\rho_{eff}$=R w h/L is 1000-10000 $\mu\Omega$cm. Note that these effective resistivities can change when different line lengths, widths and heights are chosen.

According to an exemplary embodiment of the invention, the set resistance may be increased thereby also increasing the dissipated power density, which lowers the programming current. A measure which may be taken according to exemplary embodiments of the invention, namely making use of self-organization of insulation material within a deposited phase change material, may allow to obtain a patterned line. After such a patterning, the cell formation of the insulation material in the deposited phase change material may increase the resistance of the film. Thus, a mix/combination of insulating material and a phase change material may be provided in order to increase the dissipated power density.

Providing a method by which the electrical resistance of a phase change line in the SET state can be increased so that the program current can be substantially lowered, while other properties of the line are not degraded, may increase the set resistance of a phase change RAM memory. In addition, this may enable to tailor the line resistance to a value that is required for proper or even optimal power delivery by a selected transistor.

Next, further exemplary embodiments of the electronic component will be explained. However, these embodiments also apply to the method of manufacturing an electronic component.

The plurality of islands may form a thermo-dependent structure, particularly a phase change structure that is convertible between at least two phase-states. Thus, under the influence of heat which may be generated by ohmic losses of a programming current flowing through the phase change structure and/or electrodes connected thereto and fast cooling time (for instance order of ns), the switch between the two phases can be initiated. Thermal energy may also be supplied via electromagnetic radiation.

Particularly, the phase change structure may be adapted such that a value of the electrical conductivity of the phase change material differs between the two phase-states. In one of the at least two phase states, the phase change structure may be electrically conductive. In the other phase state, the electrical conductivity may be larger or lower than in the first state, for instance the phase change structure may be superconductive or may be semiconductive or may be isolating or may be conductive as well with a modified value of conductivity. In a normal operation of the electronic component, the function of the electronic device will be influenced, will be defined or will depend on the present value of the electrical conductivity of the phase change material in the phase change structure. This may allow manufacturing memory cells, switches, actuators, sensors, etc. using the different value of the electrical conductivity of the phase change structure in the different phase modes.

The phase change structure may be adapted such that one of the two phase-states relates to a crystalline phase and the other one of the two phase-states relates to an amorphous phase of the phase change structure. Such a material property can be found in chalcogenide materials. A chalcogenide glass may be used which is a glass containing a chalcogenide element (sulphur, selenium or tellurium) as a substantial constituent. Examples for phase change materials are GeSbTe, AgInSbTe, InSe, SbSe, SbTe, InSbSe, InSbTe, GeSbSe, GeSbTeSe or AgInSbSeTe.

The different electrical properties of the islands in the at least two different states may be different values of the electrical conductivity, different values of the permittivity, different values of the magnetic permeability, different values of the capacitance, or different values of the inductance of the plurality of islands. Thus, the phase change may influence any electrical property that can be sampled, for instance may change the electrical permittivity of a dielectric, which may change a value of a capacitance of a capacitor, which may be sampled by applying a test voltage. Or, the phase change may change the magnetic permeability and consequently the inductance of an inductor, which may as well be sampled in an electronic manner.

The electronic component may comprise an electric driving and sensing circuitry adapted for driving sensing the different electrical properties of the plurality of islands in different ones of the at least two states. For instance, a test voltage may be applied to the plurality of islands, and a current flowing along the plurality of islands will depend on the phase state of the island material, since the electrical conductivity is different in the crystalline and in the amorphous phase. Such a sensing circuitry may also include selection transistors or other kinds of switches, which selectively enable or disable access to a particular electronic component of an array of electronic components. Thus, a respective selection transistor may be assigned to each one of the electronic components.

The plurality of islands may form a continuous (or uninterrupted) percolation path within the matrix, which continuous (percolation) path may be electrically conductive in at least one of the at least two states. Therefore, a sampling current may flow along the percolation path and may be sensed or detected so that, for instance in the context of a memory cell, it may be determined whether a logical state "1" or a logical state "0" is presently stored in the respective memory cell. Thus, different logical values may be encoded in different values of the electrical conductivity.

The plurality of islands may comprise a material of the group consisting of $Sb_2Te$, GeTe and $Sb_2Te_3$. In this context, the matrix may comprise an electrically insulating material such as one material of the group consisting of $GeSe_2$, GeSe, $GeS_2$ and GeS. Thus, the combination of these chemically familiar and therefore compatible materials may be advantageous to obtain an electronic component with a long service life.

The plurality of islands may have a dimension of less than 20 nm, particularly of less than 10 nm, more particularly of less than 5 nm. Therefore, extremely small islands and therefore a percolation path with a high resistivity may be achieved without the need of deposition and etching methods, since such methods may become problematic when being extended to dimensions of 20 nm and below. In contrast to this, a self-organization process may be used for the distributing the islands within the matrix, particularly for separating phases of matrix material and island material. The islands may have a 3D structure which may be similar to beads or spheres, but which may also have a lower degree of geometrical order. Surface areas of adjacent islands of a continuous path may be in direct physical contact to one another, thereby forming an uninterrupted path.

A number of molecules (or a concentration, a volume percentage, or a weight percentage) of the plurality of islands may be smaller than a number of molecules (or a concentration, a volume percentage, or a weight percentage) of the matrix, particularly may be up to four times smaller than a number of molecules of the matrix. By adjusting the relative concentration of matrix material and island material, the conductivity and the self-organization properties may be accurately adjusted.

The electronic component may comprise a first electrode (or electric terminal) and a second electrode (or electric terminal), wherein the percolation path may connect or bridge the first electrode with the second electrode. Therefore, between the first and second electrode, a heating current for heating the islands (for instance for triggering a phase change) may be applied, and also a sampling current for detecting the present state of the islands may be applied via the electrodes. For heating, it is also possible to use a separate element such as a heater which is thermally coupled to the islands and which may efficiently transfer heat (for instance Joule heat) to the islands. Alternatively, electromagnetic radiation may be used for heating the islands.

The electronic component may comprise a switch, particularly a field effect transistor or a diode, electrically coupled to the phase change structure. In such a configuration, the field effect transistor may serve as a switch to allow an access to the phase change structure, or to prevent such an access. Such a configuration may be appropriate for a memory array comprising a plurality of memory cells, allowing controlling each individual one of the memory cells using such a select transistor.

The electronic device may be adapted as a memory device. In such a memory device, the information of one or more bits may be stored in the present phase of the phase change material, particularly depending on the present one of two or more phase states of the phase change structure.

The electronic device may also be adapted as a memory array, that is a configuration of a (large) plurality of memory devices of the aforementioned type. In such a memory array, the memory cells may be arranged in a X-Y matrix-like manner and may be controlled via bit lines and word lines with transistors serving as switches to get or prevent access to desired individual memory cells and memory devices. The multiple memory cells may be monolithically integrated in a common (for instance silicon) substrate.

The electronic component may also serve as an actuator, since a change of the electrical conductivity of the phase change structure may result in a modification of an actuation signal.

It is also possible to adapt the electronic component as a microelectromechanical structure (MEMS). An electrical signal modified by a phase change of the islands may result in a specific motion of a movable component of the microelectromechanical structure (MEMS).

For any method step, any conventional procedure as known from semiconductor technology may be implemented. Forming layers or components may include deposition techniques such as CVD (chemical vapour deposition), PECVD (plasma enhanced chemical vapour deposition), ALD (atomic layer deposition), or sputtering. Removing layers or components may include etching techniques like wet etching, vapour etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The structure may be formed on a purely crystalline silicon wafer or on an SOI wafer (Silicon On Insulator).

Any process technologies like CMOS, BIPOLAR, and BICMOS may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

FIG. 3 is a cross-section of a structure obtained during manufacture of a phase change line formed of a homogeneous as deposited material according to an exemplary embodiment of the invention.

FIG. 4 is a cross-section of a structure obtained during manufacture of the phase change line of FIG. 3 after annealing and segregation according to an exemplary embodiment of the invention.

FIG. 5 illustrates an electronic component according to an exemplary embodiment of the invention.

FIG. 6 illustrates an electronic component according to an exemplary embodiment of the invention.

DESCRIPTION OF EMBODIMENTS

Figure 1:
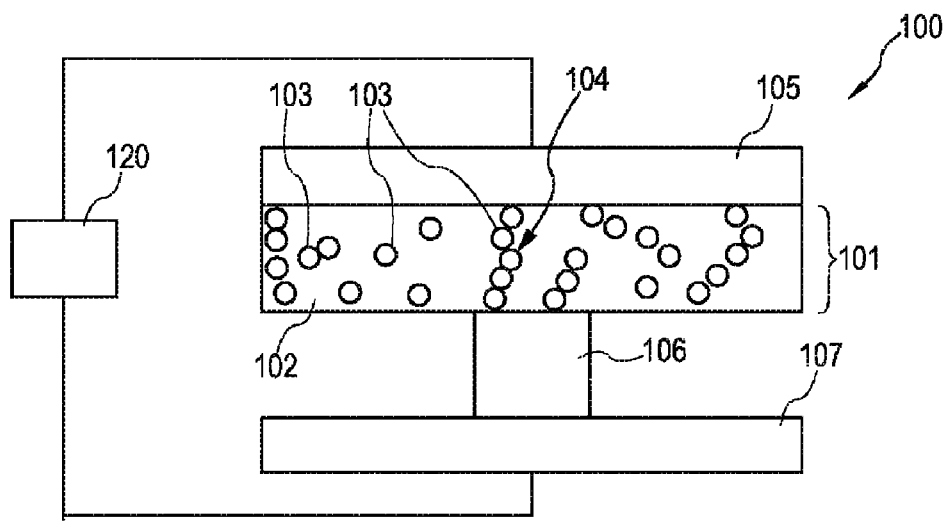
FIG. 1 illustrates an electronic memory cell device according to an exemplary embodiment of the invention.

The illustration in the drawing is schematical. In different drawings, similar or identical elements are provided with the same reference signs.

In the following, referring to FIG. 1, a memory cell 100 according to an exemplary embodiment of the invention will be explained.

The memory cell 100 comprises a phase change film 101 consisting of a matrix 102 of a single (exactly one) electrically insulating material and a number of phase change material islands 103 embedded in the matrix 102 and comprising a single (exactly one) phase change material which is convertible between a crystalline phase and an amorphous phase having different electrical properties. As can be taken from FIG. 1, in a central part of the phase change line cell 101, a plurality of the islands 103 form a continuous (percolation) path 104 allowing the conductance of an electric current between a first electrode 105 and an electrically conductive spatially narrow contact element 106 which is electrically coupled to a second electrode 107.

The contact area 106 of the bottom electrode 107 should however be small enough as to connect only a few percolation paths 104, ideally one, from the top electrode 105 to the bottom electrode 107.

The electrical conductivity of the islands 103, particularly of the percolation path 104 formed by the islands 103, depends on the actual phase state of the percolation path 104 which can be altered by applying SET pulses or RESET pulses via the application of electric current signals between the electrodes 105, 107, which may be performed under the control of a control unit 120 (such as a central processing unit, CPU, or a microprocessor).

By such a current pulse or current signal, heat is generated within the percolation path 104 that thereby changes its phase state and consequently its value of the electrical conductivity of the phase change material. The applied current pulses may have a certain shape (for instance may have a fast raising edge and a slow falling edge, or may have a raising edge which is curved to the right and a falling edge which is curved to the left) and may be characterized by different parameters (such as current amplitude, pulse duration, etc.). By adjusting the pulse parameters, it is possible to control whether the phase change material 103 is converted into a crystalline phase or is converted into an amorphous phase. Very high temperatures with rapid cooling down may result in an amorphous phase. A smaller increase in temperature or slower cooling down may lead to a crystalline phase.

By taking this measure, one bit may be stored in the memory cell 100 which may be encoded in a "high" or "low" value of the electrical resistivity corresponding to a logical value "1" and "0", or vice versa. When a sensing current is applied between the electrodes 105, 107, the actual state of the memory cell 100 may be detected.

The islands 103 are formed of $Sb_2Te$ or doped $Sb_2Te$ material, and have a (linear) dimension "d" in the order of magnitude of 10 nm or smaller. The electrically insulating matrix 102 consists of GeSe.

In the following, referring to FIG. 2, some recognitions of the inventor will be explained based on which embodiments of the invention have been developed by the inventor.

Figure 2:
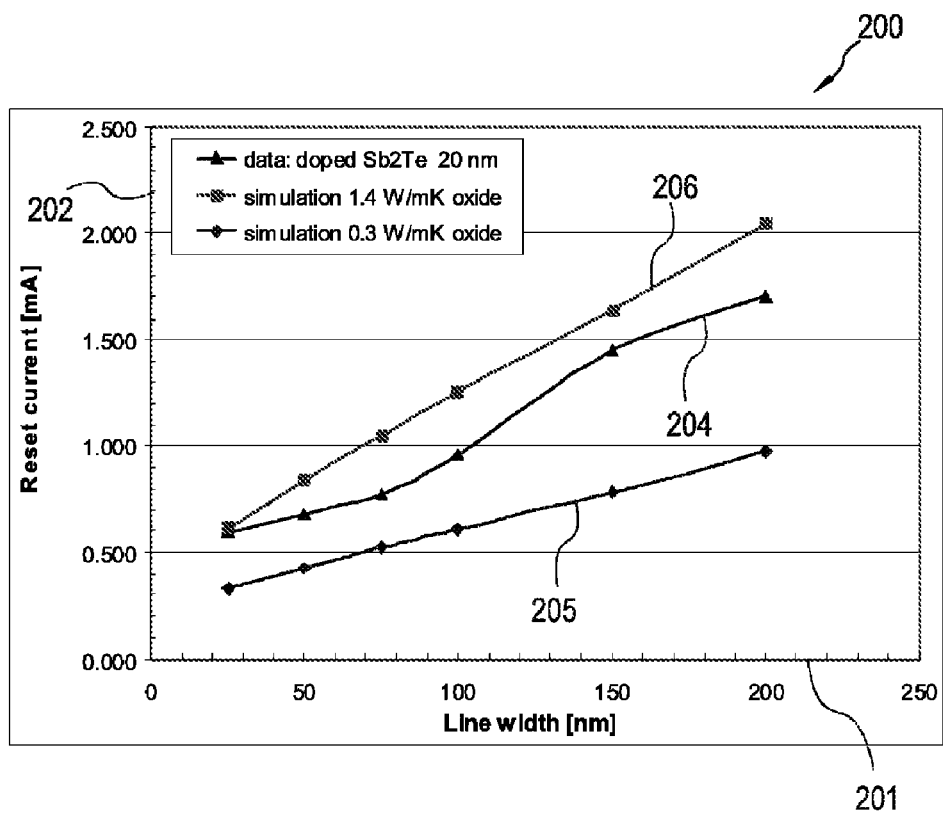
FIG. 2 is a diagram illustrating the dependence of a reset current from a width of a phase change line cell for a phase change film thickness of 20 nm and pulse duration of 50 ns.

FIG. 2 illustrates a diagram 200 having an abscissa 201 along which a width "w" (see FIG. 5) of a phase change line cell is plotted in nanometers. Along an ordinate 202, a programming current is plotted milliampere. Therefore, FIG. 2 illustrates a reset current to width dependence. Thus, FIG. 2 shows the reset current scaling of a 20 nm thick phase change line, as a function of the line width. The lines have a length of four times its width. A first line 204 illustrates measured data; whereas a second line 205 and a third line 206 represent electro-thermal simulations of the lines with a surrounding oxide with a heat conductivity of 1.4 W/mK and 0.3 W/mK, respectively.

The magnitude of the reset current used to program a phase change line cell from its crystalline state (SET state) to its amorphous state (RESET state) is a limiting factor to shrink the size of the memory cell. The reset current has been measured and simulated for phase change RAM lines made of doped $Sb_2Te$ phase change material (see WO 2004/057684) having an electrical resistivity of approximately 210 μΩcm. The phase change RAM lines had a thickness of 20 nm and a variable width of 25 nm up to 200 nm.

Thus, the results shown in FIG. 2 indicate that even for surrounding oxide with a heat conductivity of 0.3 W/mK, the reset current will not become less than 0.43 mA for a 50 nm wide line. This may limit the applicability of phase change line cell memories as a competitor for flash replacement or a multiple time programmable (MTP). For both applications, the reset current should be smaller than 300 µA.

According to an exemplary embodiment of the invention, the reset current I may be reduced by increasing the line resistance R, keeping the total programming power $P=I^2 R$ at the same magnitude. Hence, according to the relation $P=I^2 R$, the reset current I will be reduced with a square route of the line resistance R increased.

A difficulty is to increase the electrical resistivity of a phase change material without effecting all other important phase change RAM properties related to the phase change material as crystallization speed, threshold electric fields, cyclability and data retention. For instance, reducing the carrier densities by doping, antidoping or an increase in the electrical band gap may have an effect on a threshold voltage as well. Another alternative, increasing the line resistance by reducing the film thickness below 20 nm may have the disadvantage of a worse step coverage over the contact electrodes and may probably lead to a reduced reliability and cyclability.

A preferable solution to increase the electrical resistivity without compromising the other properties of the phase change material is provided by exemplary embodiments of the invention and is based on making a line cell consisting of small islands of the phase change material embedded in a matrix of an insulating material. This will only affect the resistance of the line whereas it leaves the bulk composition of a phase change material intact and does not require depositions of ultra-thin films (up to 5 nm or less). The percolation path of the current flowing through the conducting phase change islands may determine the resistance of the resulting line. Additional advantages are obtained by the solution as well. Namely, the size of polycrystalline phase change grains may be reduced from about 50 nm to the size of the island, which may be much smaller (for instance 10 nm or less) than its film thickness (for instance approximately 20 nm). This may lead to smaller distributions in the reset current of a memory array. Furthermore, the threshold voltage may be reduced as the line may be fragmented into serial portions of high and low resistance along the percolation path. Note that the threshold voltage scales linear with the size or length of the amorphous mark. Hence smaller PC lines, percolation paths or particles will result lower threshold voltages.

A self-organization process based on the segregation of two stable components (i.e. a first component and a second component) may make the matrix of conducting islands of phase-change material. One component (e.g. the first component) being a $Sb_2Te$, GeTe or $Sb_2Te_3$ phase change components. The other component (the second component) being a choice of insulators such as $GeSe_2$, GeSe, $GeS_2$ or GeS. A reason to choose these insulators is that they are chemically familiar with the GeSbTe materials, but they have a much larger heat of formation and thus the atomic elements will have a larger driving force to form bonds with each other.

TABLE 1

Heat of formation of several sulphides, selenides and tellurides, taken from K. C. Mills Thermodynamic data for Inorganic Sulphides, Selenides and Tellurides, Butherworth and Co. (Publishers) Ltd., 1974.

| Material | Heat of Formation |
| --- | --- |
| GeS | −76.1 kJ/mol |
| $GeS_2$ | −156.9 kJ/mol |
| GeSe | −69 kJ/mol |

TABLE 1-continued

Heat of formation of several sulphides, selenides and tellurides, taken from K. C. Mills Thermodynamic data for Inorganic Sulphides, Selenides and Tellurides, Butherworth and Co. (Publishers) Ltd., 1974.

| Material | Heat of Formation |
| --- | --- |
| $GeSe_2$ | −113 kJ/mol |
| GeTe | −48.5 kJ/mol |
| $GeTe_2$ | does not exist |
| $Sb_2Te_3$ | −56.5 kJ/mol |
| $Sb_2Se_3$ | −127.6 kJ/mol |
| $Sb_2S_3$ | −205 kJ/mol |

The heat of formation per sulphur or selenium atom for the $GeSe_2$, GeSe, $GeS_2$ or GeS components is much bigger than the heat of formation per sulphur or selenium atom in the GeTe, $Sb_2Te_3$, $Sb_2Se_3$ or $Sb_2S_3$ components. Therefore, without wishing to be bound to a specific theory, it is presently believed that a sputtered film of composition $(Q)_x(Y)_{1-x}$, where Q={GST 225, GST 124, GST 147 or the "doped" $Sb_2Te$ materials (see also WO2004/057684)} and Y={$GeS_2$, GeS, $GeSe_2$, GeSe} and x<0.5 will segregate into a film which will have islands of composition Q embedded in an insulating matrix of composition Y.

This is shown schematically in FIG. 3 and FIG. 4.

FIG. 3 shows a preform 300 of a phase change line cell according to an exemplary embodiment of the invention.

The preform 300 shows a cross-section of a $(Q)_x(Y)_{1-x}$ phase change line in a homogeneous "as deposited" configuration.

After annealing and segregation of the material, the phase change line cell 400 of FIG. 4 is obtained (in which the phases 102, 103 are separated) which has a film thickness "h" and a width "w".

By adjusting the variable x for instance in a range from 0.1 to 0.5, the resistance of the line 400 can be tuned from 1 to 20 times the resistance of the original phase change line, for which x=1. Ideally, the line resistance should be between two (2) kΩ and ten (10) kΩ. This will for example reduce the reset current from approximately 0.6 mA (R=400Ω) for a 50 nm wide line in FIG. 2 to 0.2 mA (R=3.6 kΩ). The "effective resistivity" within the initial lithographic patterned phase change line volume with width w, height h and length L has therefore increased from 210 µΩcm to about 2000 (=9*210) µΩcm. The average diameter of the island size of the phase change material Q will then be equal or smaller than the film thickness h. The diameter size in clustering can be controlled by using different annealing temperatures and annealing durations.

FIG. 5 shows a top view of a phase change line 500 (length L, width w) with a segregated $(Q)_x(Y)_{1-x}$ material. The meandering line 104 indicates a percolation path of the islands 103 of phase change material Q.

FIG. 6 shows a top view of a phase change line 600 (length L, width w) with a segregated $(Q)_x(Y)_{1-x}$ material. The thin layers 103 formed by segregation each indicate a percolation path 104 of phase change material Q.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. An electronic component, the electronic component comprising
   a matrix;
   a plurality of islands embedded in the matrix, the island comprising a material which is convertible between at least two states characterized by different electrical properties;
   wherein the plurality of islands form a continuous path in the matrix.

2. The electronic component according to claim 1, wherein the plurality of islands forms a thermo-dependent structure.

3. The electronic component according to claim 1, wherein the material of the plurality of islands is electrically conductive in at least one of the at least two states.

4. The electronic component according to claim 1, wherein the different electrical properties are at least one of the group consisting of different values of the electrical conductivity, different values of the permittivity, different values of the magnetic permeability, different values of the capacitance, and different values of the inductance of the plurality of islands or of a member comprising the plurality of islands.

5. The electronic component according to claim 1, comprising an electric driving and sensing circuitry adapted for driving and sensing the different electrical properties of the plurality of islands in different ones of the at least two states.

6. The electronic component according to claim 1, wherein the plurality of islands are adapted such that one of the at least two states relates to a crystalline phase and another one of the at least two states relates to an amorphous phase of the material of the plurality of islands.

7. The electronic component according to claim 1, wherein the plurality of islands form a continuous electrically conductive path in the matrix in at least one of the at least two states.

8. The electronic component according to claim 1, wherein the plurality of islands comprise a material of the group consisting of $Sb_2Te$, doped $Sb_2Te$, GeTe, $Sb_2Te_3$ and any linear combination of <GeTe> and <$Sb_2Te_3$>.

9. The electronic component according to claim 1, wherein the plurality of islands have a dimension of less than 20 nm.

10. The electronic component according to claim 1, wherein the matrix comprises an electrically insulating material.

11. The electronic component according to claim 1, wherein the matrix comprises an electrically insulating material having a value of the resistance which is larger than a value of the resistance of the continuous path in a crystalline state and/or having a value of the resistivity which is larger than a value of the resistivity of the continuous path in a crystalline state.

12. The electronic component according to claim 1, wherein the matrix comprises an electrically insulating material having a value of the resistance which is larger than a value of the resistance of the continuous path in an amorphous state and/or having a value of resistivity which is larger than a value of the resistivity of the continuous path in an amorphous state.

13. The electronic component according to claim 1, wherein the matrix comprises a material of the group consisting of $GeSe_2$, GeSe, $GeS_2$, and GeS.

14. The electronic component according to claim 1, wherein a number of molecules of the plurality of islands is smaller than a number of molecules of the matrix.

15. The electronic component according to claim 1, comprising a first electrode and a second electrode, the continuous path being connected between the first electrode and the second electrode.

16. The electronic component according to claim 1, adapted as one of the group consisting of a memory device, a memory array, a gain controller, an actuator, a microelectromechanical structure, a controller, and a switch.

17. The electronic component according to claim 1, wherein the plurality of islands include a material of the group consisting of $Sb_2Te$, doped $Sb_2Te$, GeTe, $Sb_2Te_3$ and any linear combination of GST 124, GST 225 and GST 147.

18. The electronic component according to claim 1, wherein the plurality of islands have a dimension of less than 10 nm.

19. The electronic component according to claim 1, wherein the plurality of islands have a dimension of less than 5 nm.

20. The electronic component according to claim 1, wherein a number of molecules of the plurality of islands is up to five times smaller than a number of molecules of the matrix.

21. The electronic component according to claim 1, wherein the plurality of islands forms a phase change structure which is convertible between at least two phase states.

22. A method of forming an electronic component, the method comprising
   embedding a plurality of islands, comprising a material which is convertible between at least two states characterized by different electrical properties, in a matrix;
   forming a continuous path of the plurality of islands in the matrix.

23. The method according to claim 22, wherein the continuous path is formed by a self-organization process.

24. The method according to claim 22, wherein the continuous path is formed by thermally annealing a mixture of a material of the plurality of islands with a material of the matrix.

25. The method according to claim 24, wherein the continuous path is formed by thermally annealing the mixture to a temperature of at least 250° C.

26. The method according to claim 24, wherein the continuous path is formed by thermally annealing the mixture for a duration of at least 1 second.

* * * * *